(12) United States Patent
Hsieh et al.

(10) Patent No.: US 9,430,323 B2
(45) Date of Patent: Aug. 30, 2016

(54) POWER MODE REGISTER REDUCTION AND POWER RAIL BRING UP ENHANCEMENT

(71) Applicant: Broadcom Corporation, Irvine, CA (US)

(72) Inventors: Chih-Tsung Hsieh, Taipei (TW); Hao-zheng Lee, Taipei (TW); Walid Nabhane, Long Valley, NJ (US); Veronica Alarcon, San Jose, CA (US); Mark Norman Fullerton, Austin, TX (US)

(73) Assignee: Broadcom Corporation, Irvine, CA (US)

( * ) Notice: Subject to any disclaimer, the term of this patent is extended or adjusted under 35 U.S.C. 154(b) by 359 days.

(21) Appl. No.: 13/950,738

(22) Filed: Jul. 25, 2013

(65) Prior Publication Data

US 2014/0223153 A1    Aug. 7, 2014

Related U.S. Application Data

(60) Provisional application No. 61/759,470, filed on Feb. 1, 2013, provisional application No. 61/833,598, filed (Continued)

(51) Int. Cl.
*G06F 1/26* (2006.01)
*G06F 11/10* (2006.01)
(Continued)

(52) U.S. Cl.
CPC ........... *G06F 11/1048* (2013.01); *G01R 31/36* (2013.01); *G05F 1/625* (2013.01); *G06F 1/26* (2013.01); *G06F 1/3206* (2013.01); *G06F 1/3287* (2013.01); *G06F 11/1016* (2013.01); *G06F 11/3062* (2013.01); *G06F 11/3093* (2013.01); *G06F 13/126* (2013.01); *G11C 7/106* (2013.01); *G11C 7/1072* (2013.01); *H02J 7/0029* (2013.01); *G01R 19/003* (2013.01);

(Continued)

(58) Field of Classification Search
CPC .... G01R 19/003; G01R 31/36; G01R 31/40; G05F 1/625; G06F 11/3031; G06F 11/3058; G06F 11/3062; G06F 11/3093; G06F 13/126; G06F 1/26; G06F 1/3206; G06F 1/3287; G06F 11/1016; G06F 11/1048; H02J 7/0029; G11C 7/106; G11C 7/1072
See application file for complete search history.

(56) References Cited

U.S. PATENT DOCUMENTS

2003/0115491 A1* 6/2003 Williams et al. ............. 713/300
2009/0204835 A1* 8/2009 Smith et al. .................. 713/323

(Continued)

*Primary Examiner* — Thomas Lee
*Assistant Examiner* — Chad Erdman
(74) *Attorney, Agent, or Firm* — McDermott Will & Emery LLP

(57) ABSTRACT

Aspects of power mode register reduction and power rail bring up enhancements are described. In one embodiment, an operating parameter for a first power rail is set by power management circuit according to a predetermined programmed setting. In connection with a wait time, the power rail is enabled, and a processor is released to start. In turn, at least one of a command to modify the operating parameter for the first power rail or a command to set an operating parameter for a second power rail is received from the processor over a high speed interface. By accessing a grouped operating register for a group of power rails, the processor can update or modify settings of an entire group of power rails at one time. In connection with the processor, the power management circuit can power up a plurality of power rails in a flexible and efficient manner.

20 Claims, 4 Drawing Sheets

Related U.S. Application Data on Jun. 11, 2013, provisional application No. 61/834,513, filed on Jun. 13, 2013, provisional application No. 61/836,327, filed on Jun. 18, 2013, provisional application No. 61/836,306, filed on Jun. 18, 2013, provisional application No. 61/836,895, filed on Jun. 19, 2013, provisional application No. 61/836,886, filed on Jun. 19, 2013, provisional application No. 61/836,903, filed on Jun. 19, 2013.

(51) Int. Cl.
| | | |
|---|---|---|
| *G05F 1/625* | (2006.01) | |
| *G06F 13/12* | (2006.01) | |
| *G01R 31/36* | (2006.01) | |
| *H02J 7/00* | (2006.01) | |
| *G06F 1/32* | (2006.01) | |
| *G11C 7/10* | (2006.01) | |
| *G06F 11/30* | (2006.01) | |
| *G01R 31/40* | (2014.01) | |
| *G01R 19/00* | (2006.01) | |

(52) U.S. Cl.
CPC ........... *G01R 31/40* (2013.01); *G06F 11/3031* (2013.01); *G06F 11/3058* (2013.01); *Y02B 60/1282* (2013.01)

(56) References Cited

U.S. PATENT DOCUMENTS

| | | | |
|---|---|---|---|
| 2009/0315399 A1* | 12/2009 | Shikata ........................... 307/38 |
| 2010/0231044 A1* | 9/2010 | Tatsumi et al. .................. 307/39 |
| 2011/0022859 A1* | 1/2011 | More et al. ..................... 713/300 |
| 2011/0316616 A1* | 12/2011 | Yoda ....................... G06F 1/263 |
| | | | 327/535 |
| 2012/0117364 A1* | 5/2012 | Rosenquist et al. .............. 713/2 |
| 2013/0124895 A1* | 5/2013 | Saha ......................... G06F 1/26 |
| | | | 713/323 |

\* cited by examiner

POWER MODE REGISTER REDUCTION AND POWER RAIL BRING UP ENHANCEMENT

CROSS-REFERENCE TO RELATED APPLICATIONS

This application claims the benefit of:

U.S. Provisional Application No. 61/759,470, filed Feb. 1, 2013;

U.S. Provisional Application No. 61/833,598, filed Jun. 11, 2013;

U.S. Provisional Application No. 61/834,513, filed Jun. 13, 2013;

U.S. Provisional Application No. 61/836,327, filed Jun. 18, 2013;

U.S. Provisional Application No. 61/836,306, filed Jun. 18, 2013;

U.S. Provisional Application No. 61/836,895, filed Jun. 19, 2013;

U.S. Provisional Application No. 61/836,886, filed Jun. 19, 2013; and

U.S. Provisional Application No. 61/836,903, filed Jun. 19, 2013, the entire contents of each of which are hereby incorporated herein by reference.

This application also makes reference to:

U.S. patent application Ser. No. 13/950,716, titled "Clock Domain Crossing Serial Interface, Direct Latching, and Response Codes" and filed on even date herewith;

U.S. patent application Ser. No. 13/950,725, titled "Power and System Management Information Visibility" and filed on even date herewith;

U.S. patent application Ser. No. 13/950,750, titled "Dynamic Power Profiling" and filed on even date herewith;

U.S. patent application Ser. No. 13/950,762, titled "Charger Detection and Optimization Prior to Host Control" and filed on even date herewith;

U.S. patent application Ser. No. 13/950,769, titled "Enhanced Recovery Mechanism" and filed on even date herewith; and U.S. patent application Ser. No. 13/950,776, titled "Dynamic Power Mode Switching Per Rail" and filed on even date herewith, the entire contents of each of which are hereby incorporated herein by reference.

BACKGROUND

Battery-powered computing systems and devices have been adopted for use in many aspects of daily life. As these systems and devices are more widely adopted and used in place of other computing systems and devices, they are designed to be more flexible and powerful, but are also more complex. With advances in the design of battery-powered computing devices, the availability of sufficient power for the devices continues to be an ongoing concern.

Further, with the increased complexity in battery-powered systems, the number of power rails required to power different subsystems and processors is increasing. In some cases, certain ones of these different subsystems and processors must be powered up at different times, in a certain order, and at different voltages.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
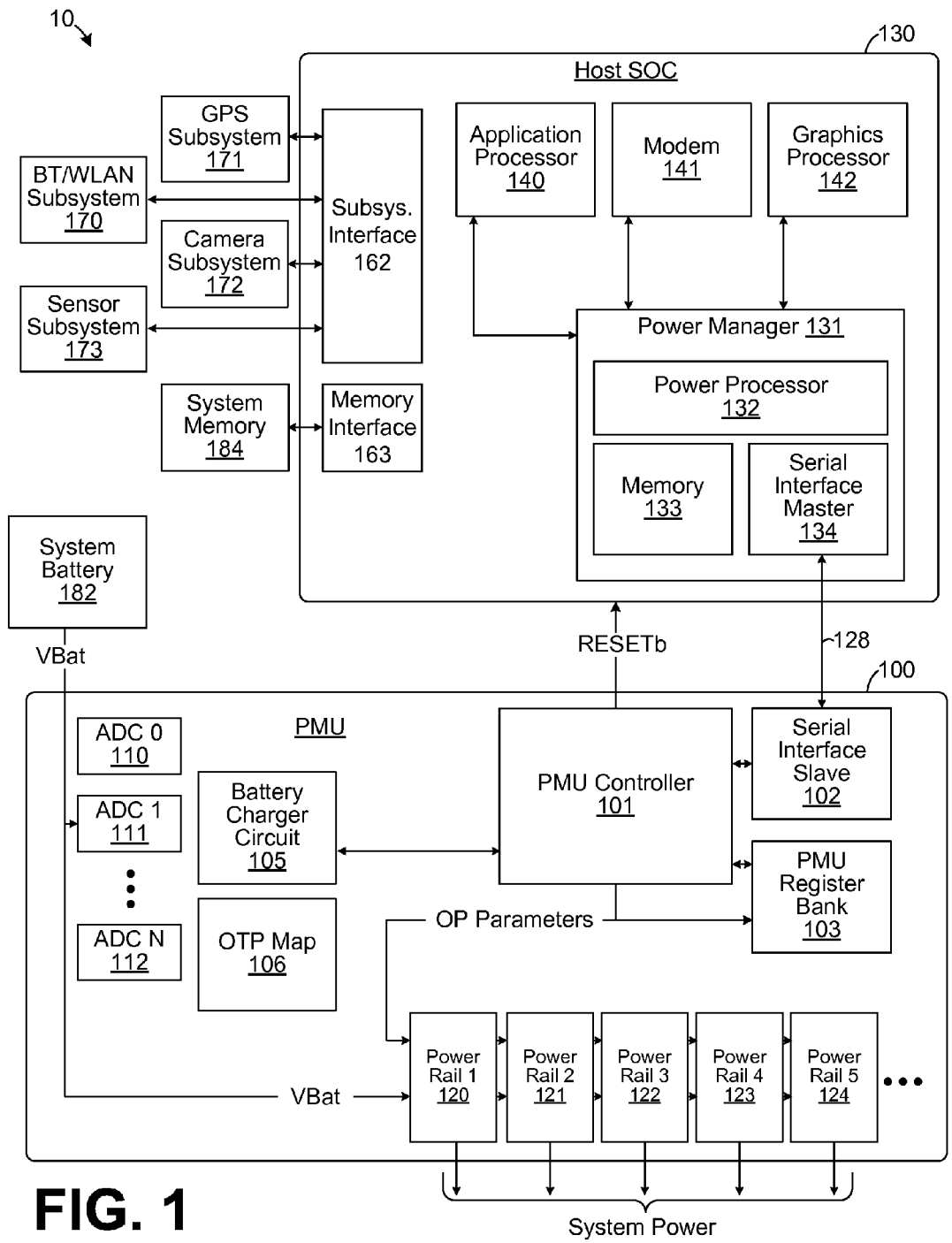
FIG. 1 illustrates a system including power mode register reduction and power rail bring up enhancements according to an example embodiment.

With the increased complexity in battery-powered systems, the number of power rails required to power different subsystems and processors is increasing. In some cases, certain ones of these different subsystems and processors must be powered up at different times, in a certain order, and at different voltages.

In some battery-powered systems, a power management unit or circuit is relied upon to control power rails for subsystems and processors in the systems. Depending upon the system, the power management unit may be responsible for configuring several power rails during a boot process. Further, it should be appreciated that, when several power rails are required, it is usually the case that the power rails should not be turned on simultaneously. Rather, to avoid high current spikes, system battery voltage collapse, etc., power rails are enabled or powered up in a staggered fashion over time. Thus, in addition to the individual operating parameters of various power rails, the power management unit may also be responsible for maintaining a certain power up sequence for the power rails.

Programmable memory arrays have been relied upon in power management units to store operating parameters and power up timings for power rails. In the programmable memory arrays, the operating parameters and power up timings for power rails may be predetermined and/or programmed, for reference. Thus, upon power up of a power management unit, the power management unit may refer to the settings in the programmable memory array to determine the appropriate operating parameters and power on timings for power rails.

In certain conventional systems, the operating parameters and power up timings for power rails were programmed to memory for several power modes. Sometimes, these power modes were directly addresses by dedicated hardware power control pins. Some systems relied upon three or more power control pins to address various predetermined power states. While the power control pins could be relied upon to quickly transition one or more power rails to predetermined voltage and/or current operating settings, memory was required to store the parameters associated with those operating settings, increasing costs. According to the embodiments described herein, such power control pins are rendered unnecessary and are omitted.

As described above, because battery-powered systems rely upon an increased number of power rails in each new generation of devices, the amount of programmable memory is increasing, adding to cost. The cost is associated not only with the programmable memory itself, but also to the cost of programming the memory. In this context, the embodiments described herein include a new arrangement and organization of operating registers for power rails, a new and flexible manner in which to power up power rails, and further enhancements to the manner in which power rails are powered up and adjusted over time. The embodiments reduce cost, increase speed, and provide new flexibility for battery-powered systems.

In this context, aspects of power mode register reduction and power rail bring up enhancements are described. In one embodiment, an operating parameter for a first power rail is set by power management circuit according to a predetermined programmed setting. In connection with a wait time, the power rail is enabled, and a processor is released to start. In turn, at least one of a command to modify the operating parameter for the first power rail or a command to set an operating parameter for a second power rail is received from the processor over a high speed interface. By accessing a grouped operating register for a group of power rails, the processor can update or modify settings of an entire group of power rails at one time. In connection with the processor, the power management circuit can power up a plurality of power rails in a flexible and efficient manner.

As compared to conventional systems, a minimum number of power rails are set according to the predetermined programmed settings before releasing the processor to start. In this case, the power management circuit only needs to store the predetermined programmed settings for the minimum number of power rails necessary to support power for the processor. Thus, the amount of memory or number of registers required to store predetermined settings for power rails is reduced.

Turning now to the drawings, an introduction and general description of exemplary embodiments of a system is provided, followed by a description of the operation of the same.

I. System Introduction

FIG. 1 illustrates a system 10 for power system management information visibility according to an example embodiment. The system 10 may embody a computing device that includes a number of general and/or specific purpose circuits, processing circuits, processors, registers, memories, sensors, displays, etc. In one embodiment, the system 10 may embody a handheld or portable computing device which is powered from charge stored in a battery. In various embodiments, the system 10 may be embodied as part of a cellular telephone, tablet computing device, laptop computer, or other computing device. Alternatively, because the embodiments described herein are not limited to use in handheld or portable computing devices, the system 10 may be embodied as part of a desktop or set top computing device, for example. Although not illustrated in FIG. 1, it should be appreciated that the system 10 may include one or more displays, microphones, speakers, buttons, indicator lights, haptic feedback elements, memory card readers, etc.

Among other elements, the system 10 includes a power management unit (PMU) 100, a host system-on-chip (SOC) 130, a system battery 182, and a system memory 184. The system 10 also includes certain subsystems such as a bluetooth/wireless local area network (WLAN) subsystem 170, a global positioning system (GPS) subsystem 171, a camera subsystem 172, and a sensor subsystem 173. The subsystems 170-173 are representative subsystems which may be included as elements of the system 10, and other subsystems are within the scope and spirit of the embodiments described herein. It is noted that, just as the host SOC 130 requires power for operation, each of the subsystems 170-173, the system memory 184, and other elements and circuits of the system 10 depend on power for operation. As discussed below, this power may be supplied by and under the control of the PMU 100.

The system battery 182 may be embodied as any rechargeable battery suitable for the application, such as a lithium-ion, nickel-metal-hydride, or other battery variant, without limitation. The system memory 184 may be embodied as a volatile and/or non-volatile random access memory or combination thereof. The system memory 184 may store computer-readable instructions thereon that, when executed by one or more of the processors 140-142 of the host SOC 130, for example, direct the processors 140-142 to execute various aspects of the embodiments described herein.

In general, the PMU 100 controls and/or facilitates control of the distribution of power from the system battery 182 to the elements of the system 10, such as the host SOC 130, the subsystems 170-173, and the system memory 184, for example. As further described below, depending upon the operating state of the system 10 and/or other factors, the PMU 100 may control the distribution of power to one or more elements of the system 10, or the PMU 100 may receive instructions to control the distribution of power to one or more elements of the system 10.

Among other elements, the PMU 100 includes a PMU controller 101, a serial interface slave 102, a PMU register bank 103, a battery charger circuit 105, a one time programmable (OTP) map 106, a number 0-N of analog-to-digital (ADC) circuits 110-112, and a number of power rail circuits 120-124. It is noted that FIG. 1 illustrates a representative example of elements of the PMU 100, and it should be appreciated that the PMU 100 may include other elements, such as additional power rails, in various embodiments.

In general, each of the power rails 120-124 includes a low dropout regulator (LDO) or switching type of power rail. An LDO power rail includes a linear voltage regulator that operates suitably even with a relatively low differential input vs. output voltage. A switching power rail includes an active switching circuit that charges and/or discharges reactive circuit elements to boost voltage or current, for example. It should be appreciated that each of the power rails 120-124 is embodied as either an LDO or switching power rail depending upon certain factors such as output voltage, input/output differential voltage, sourced current, power dissipation, cost, etc. In one embodiment, the PMU 100 includes 8 switching and 24 LDO power rails, although the PMU 100 may include any number of power rails suitable for the application.

The PMU 100 may set operating parameters for each of the power rails 120-124. For example, among other operating parameters, one or more of the power rails 120-124 may be set to normal, low power, or off modes of operation. Also one or more of the power rails 120-124 may be set to a certain output voltage by the PMU 100. In certain aspects, the PMU 100 may set operating parameters of one or more of the power rails 120-124 according to commands received from the power manager 131 via the serial interface 128.

Among other elements, the host SOC 130 includes general and/or application specific processors. In FIG. 1, the host SOC 130 includes a power manager 131, an application processor 140, a modem 141, and a graphics processor 142. In various embodiments, the host SOC 130 may omit one or more of the processors 140-142 or include processors in addition to the processors 140-142. The host SOC 130 also includes a subsystem interface 162 and memory interface 163. The subsystem interface 162 and the memory interface 163 electrically and communicatively couple the subsystems 170-173 and the system memory 184 to the host SOC 130 and, particularly, to one or more of the processors 140-142.

The application processor 140 may be embodied as a general purpose processor for executing various applications. For example, the application processor 140 may execute an underlying operating system along with applications such as e-mail, short message service (SMS), telephone, camera, web-browser, and other applications, without limitation. As compared to the PMU 100 and/or the power manager 131, the application processor 140 may consume relatively more power during operation. The modem 141 may include a cellular-based (or similar) communications processor for the communication of data wirelessly in connection with radio-frequency front end circuitry, and the graphics processor 142 may include a processor for driving a display of the system 10.

The power manager 131 includes a power processor 132, a memory 133, and a serial interface master 134. The power processor 132 may be embodied as a relatively small and low power processor or processing circuit for interfacing with the PMU 100 via a serial interface 128. In one embodiment, the serial interface master 134 of the power manager 131 controls the serial interface 128, although the PMU 100 may control the serial interface 128 in other embodiments. The memory 133 stores computer-readable instructions for execution by the power processor 132.

II. System Operation

With reference to the elements of the system 10 introduced above, aspects of the operation of the system 10 are described below.

A. PMU Operation

The PMU 100 may be designed, adapted, and configured to perform operations that support the host SOC 130, the subsystems 170-173, the system memory 184, and other elements of the system 10. The PMU 100 may gather system parameters for the system 10, such as power and management system status data (i.e., "system parameters," "system status data", etc.), in various modes of operation.

The PMU controller 101 generally coordinates and controls the operations of the PMU 100. The PMU controller 101 may be embodied as a general or specific purpose circuit, processing circuit, processor, state machine, etc. The PMU controller 101 interfaces with the battery charger circuit 105 to charge the system battery 182 when power for charging is available, interfaces with the serial interface slave 102 to communicate with the host SOC 130 over the serial interface 128, interfaces with the power rail circuits 120-124 to control power to the system 10, and interfaces with the PMU register bank 103 to store and access data associated with the status of the PMU 100 and the system 10. Additionally, the PMU controller 101 interfaces with other elements of the PMU 100, such as the ADCs 110-112 and the OTP map 106.

As further described below, the PMU register bank 103 may include operating registers for the power rails 120-124. By accessing the operating registers, operating parameters for the power rails 120-124 may be set by the PMU controller 101. Also, the operating parameters may be set by the power manager 131 of the host SOC 130 by sending commands over the serial interface 128. Generally, the operating registers include bit entries to set the operating mode of the power rails 120-124, bit entries to set output voltage levels of the power rails 120-124, and/or bit entries for other operating settings of the power rails 120-124. It is noted, however, that the operation of the power rails 120-124, individually, may differ from rail to rail. For example, certain power rails may be fixed to a certain output voltage or have limited operating modes (e.g., on/off).

In various embodiments, certain operating registers may be embodied as grouped operating registers. A grouped operating register may be arranged to set parameters for a group of power rails. In this context, it is noted that each of the operating registers may be embodied as a 4, 8, 16, etc. bit register, and each register may be accessed in its entirety for read and write access. Thus, if on/off operating parameters for a group of 8 power rails are combined into a single grouped operating register, then each of the 8 power rails may be set to an on or off state according to a single write operation.

The serial interface slave 102 comprises one end of the serial interface 128 that facilitates communication between the PMU 100 and the host SOC 130. Among various modes and states of operation of the system 10, the serial interface 128 is relied upon to communicate system parameters or system status data between the PMU 100 and the host SOC 130. According to certain aspects, the serial interface slave 102 may permit direct latching of data written to certain operating parameters for power rails in the PMU register bank 103, increasing the speed of power rail operations.

The OTP map 106 includes an array of programmable fuses or similar circuit elements that may each be programmed to retain a logical value. In this context, the OTP map 106 may be programmed during an initial test of the PMU 100 after manufacture, for example, or at another suitable time. The logical values retained in the OTP map 106 may be referenced by the PMU controller 101, to direct conditional operations of the PMU controller 101 and set initial settings for the PMU 100. For example, the logical values retained in the OTP map 106 may be relied upon to store initial voltage settings, for example, for one or more of the power rail circuits 120-124.

Depending upon the operating status of the system 10, the PMU controller 101 may directly set the voltage and/or current settings for one or more of the power rails 120-124 based on the logical values retained in the OTP map 106, for example, and/or other factors. Additionally or alternatively, depending upon the operating status of the system 10, as described herein, the PMU controller 101 may set voltage settings, current settings, and/or power operating modes for one or more of the power rails 120-124 based on commands received from the host SOC 130 via the serial interface 128, as further described below.

In certain conventional systems, operating parameters and power up timings for power rails were programmed into the OTP map 106 for several power modes including operating parameters and timings for several power rails. A significant amount of memory was required in the OTP map 106 to store the parameters associated with those operating parameters and timings. In the case of the embodiments of the system 10 described herein, a minimum number of power rails are set according to predetermined settings stored in the OTP map 106 before the power manager 131 is released to start. In this case, the PMU 100 only needs to store the predetermined settings for the minimum number of power rails necessary to support power for the power manager 131. After the power manager 131 boots, the PMU 100 receives commands from the power manager 131 to set operating parameters for other power rails in the PMU 100. The commands are received quickly over the serial interface 128. In this way, the overall size of the OTP map 106 can be reduced, because it is no longer necessary to store as many predetermined settings for power rails.

B. Host SOC Operation

The host SOC 130 may be generally embodied as a full system-on-chip semiconductor device. In this sense, the host SOC 130 integrates various general and/or application specific processors and processing circuits into a single integrated circuit package, reducing space. Overall, the power manager 131 of the host SOC 130 supports the host SOC 130 and the power requirements of the host SOC 130.

The power manager 131 of the host SOC 130 may retrieve and evaluate the power and management system status data stored in the PMU 100, while coordinating a power up sequence for the host SOC 130 and/or the subsystems 170-173 with the PMU 100. As described in further detail below, the power processor 132 of the power manager 131 and the PMU 100 may operate in connection with each other to power up elements in the system 10. On the basis of system status data received from the PMU 100, for example, the power processor 132 and the PMU 100 may conditionally power up elements in the system 10 in various sequences or modes of operation.

In the context of power up of the host SOC 130, it is noted that each of the power manager 131, the application processor 140, the modem 141, and the graphics processor 142 may be powered by one of the power rails 120-124 of the PMU 100. Each of these power rails may be electrically coupled from the PMU 100 to the host SOC 130 by one or more respective power traces in the system 10 and power pins or pads of the PMU 100 and the host SOC 130. Other power rails of the PMU 100 are respectively coupled to system elements in the system 10, as necessary, for supplying power. According to certain aspects described herein, because the power manager 131 of the host SOC 130 operates as a type of partner with the PMU 100 for power management in the system 10, the PMU 100 generally powers and releases the power manager 131 for start while the remaining processors and systems of the host SOC 130 and/or the system 10 are left without power until a later time.

In view of the context provided above, it is noted that each of the application processor 140, the modem 141, the graphics processor 142, and other elements in the system 10 may be transitioned from a powered-off to a powered-on mode at a different respective time or timing, as determined by the power manager 131 and/or the PMU 100.

Figure 2:
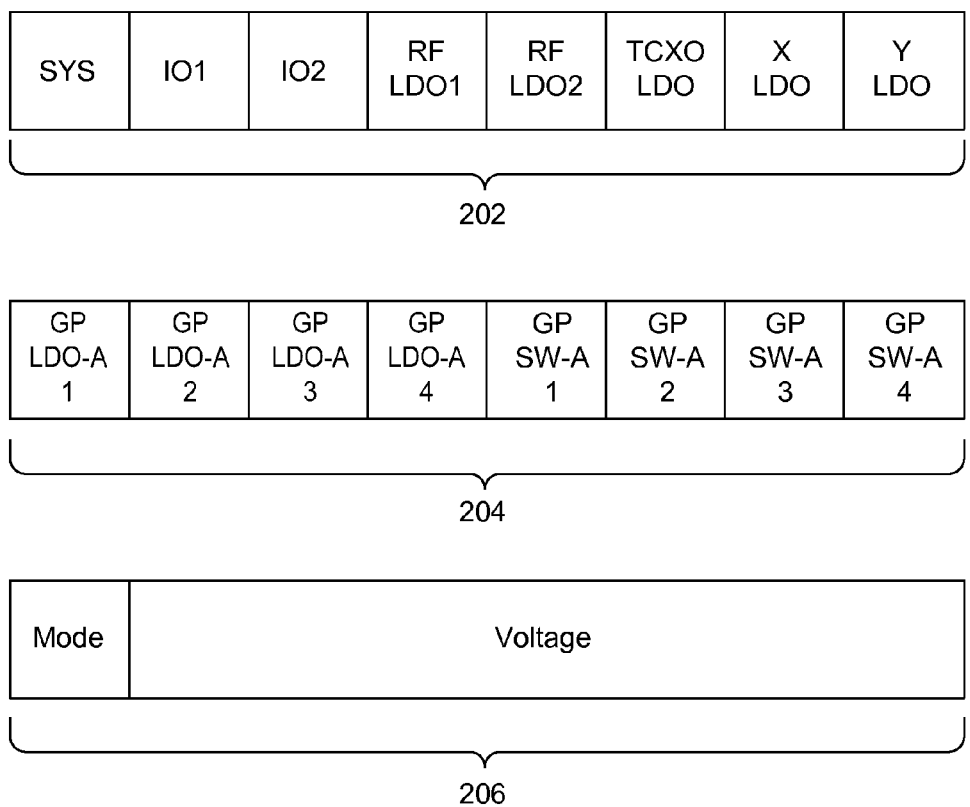
FIG. 2 illustrates arrangements of various operating registers for power rails in the system of FIG. 1 according to an example embodiment.

FIG. 2 illustrates arrangements of various operating registers for power rails in the system 10 of FIG. 1 according to an example embodiment. In FIG. 2, two grouped operating registers, 202 and 204, and one general operating register 206, are illustrated. According to one example, the grouped operating register 202 includes 16 bits, arranged in 2 bit entries for each of the SYS, IO1, IO2, RFLDO1, RFLDO2, TCXOLDO, XLDO, and YLDO power rails (i.e., grouped power rails). Further, the grouped operating register 204 includes 16 bits, arranged in 2 bit entries for each of the GPLDO-A 1-4 and GPSW-A 1-4 power rails. In general, a grouped operating register comprises at least one power mode bit entry for each power rail in a group of power rails.

The SYS, IO1, IO2, RFLDO1, RFLDO2, TCXOLDO, XLDO, and YLDO power rails may be relied upon in the system 10 to power various elements in the system 10, such as the host SOC 130, the subsystems 171-173, the system memory 184, etc., or parts thereof. The SYS, IO1, IO2, RFLDO1, RFLDO2, TCXOLDO, XLDO, and YLDO power rails, generally, are provided by way of example and for purposes of representative description of aspects of the embodiments. The PMU 100 may include any number of power rails in various embodiments, and the system 10 may include elements that rely upon power from various power rails.

The general operating register 206 includes 2 bit entries for mode settings, and 14 bit entries for a voltage setting. The system 10 may include several grouped and general operating registers 202, 204, and 206 corresponding to the power rails in the system 10, which may vary among embodiments. It should be appreciated that the arrangement of bits in the registers 202, 204, and 206 and the sizes of the registers 202, 204, and 206 are provided by way of example only and other arrangements and sizes are within the scope and spirit of the embodiments described herein. It should further be appreciated that the number of bits in the registers 202, 204, and 206 are provided by way of example only and other sizes of registers, without limitation, are within the scope and spirit of the embodiments described herein. Among other sizes, the registers 202, 204, and 206 may include 16, 32, 64, etc. bits and rely upon any suitable arrangement of the bits for mode and voltage settings.

Table 2, below, provides a summary of operating modes, voltage settings, and groupings for the power rails identified among the registers 202, 204, and 206 in FIG. 2.

TABLE 2

| Power Rail | Operating Mode(s) | Voltage Output | Grouping |
|---|---|---|---|
| SYS | ON, LPM, OFF | OTP/V | A |
| IO1 | ON, LPM, OFF | OTP/V | A |
| IO2 | ON, LPM, OFF | OTP/V | A |
| RFLDO1 | ON, LPM, OFF | OTP/V | A |
| RFLDO2 | ON, LPM, OFF | OTP/V | A |
| TCXOLDO | ON, LPM, OFF | OTP/V | A |
| XLDO | ON, LPM, OFF | OTP | A |
| YLDO | ON, LPM, OFF | OTP | A |
| GPLDO-A 1-4 | ON, LPM, OFF | V | B |
| GPSW-A 1-4 | ON, LPM, OFF | V | B |
| GPLDO-B 1-N | ON, LPM, OFF | V | NONE |
| GPSW-B 1-N | ON, LPM, OFF | V | NONE |
| GPLDO-C 1-N | ON, OFF | V | NONE |
| GPSW-C 1-N | ON, OFF | V | NONE |

Before turning to the details of Table 2, it is noted that the power rails identified in Table 2 may be embodied as the power rails 120-124 of the system 10 in FIG. 1. Particularly, it is noted that, as described above, the system 10 may include a power rail 120-124 for each power rail listed in Table 2. In Table 2, the operating modes, voltage settings, and groupings for power rails are listed. For example, each of the power rails other than the general purpose LDOs GPLDO-C 1-N and the general purpose switching power rails GPSW-C 1-N may be operated in ON, low power LPM, and OFF modes. In the example settings of the rails in TABLE 2, the general purpose LDOs GPLDO-C 1-N and the general purpose switching power rails GPSW-C 1-N may be operated in ON and OFF modes.

In the ON mode, a power rail may be able to source a maximum amount of current based on the design of the power rail, depending upon demand. In the LPM mode, a power rail may be able to source a certain nominal amount of current at a higher overall efficiency (e.g., with less power loss). Thus, when the demands for power in the system 10 are expected to be low, one or more power rails in the system 10 may be transitioned into the LPM mode to conserve power. A power rail may be turned off in the OFF mode. The use of additional or fewer operating modes for power rails is within the scope and spirit of the embodiments described herein. Using two bits, the ON, LPM, and OFF modes may be selected by 00, 01, and 10 bit values in the registers 202, 204, and 206, for example, although any other suitable logic arrangement may be relied upon.

With reference to voltage settings, the SYS, IO1, IO2, RFLDO1, RFLDO2, TCXOLDO, XLDO, and YLDO power rails may be set to the same or respective different voltage settings. In particular, during an initial power up, as further described below with reference to FIG. 3, the PMU controller 101 of the PMU 100 may read operating parameters programmed in the OTP map 106 to determine voltage settings for the SYS, IO1, IO2, RFLDO1, RFLDO2, TCXOLDO, XLDO, and YLDO power rails. These initial OTP voltage settings, for certain registers, may be modified over time by the PMU 100 and/or the host SOC 130. Voltage settings for some power rails, such as the XLDO and YLDO power rails, may be set according to operating parameters programmed in the OTP map 106 and may not be modified over time.

One or more of the SYS, IO1, IO2, RFLDO1, RFLDO2, TCXOLDO, XLDO, and YLDO power rails may represent, for example, a minimum number of power rails that must be powered up before the power manager 131 is released to start. Thus, in one example embodiment, the PMU 100 only needs to store predetermined programmed settings for one or more of the SYS, IO1, IO2, RFLDO1, RFLDO2, TCXOLDO, XLDO, and YLDO power rails in the OTP map 106. After the power manager 131 is powered up, the power manager 131 may communicate commands to the PMU 100 to set operating parameters and settings for other power rails. Thus, the overall size of the OTP map 106 may be reduced as compared to systems which require memory to store settings for additional power rails.

According to other aspects, in one embodiment, while mode settings for grouped power rails are provided in group registers 202 or 204, additional registers are provided in the system 10 to set voltage settings for individual power rails of the grouped power rails.

Figure 3:
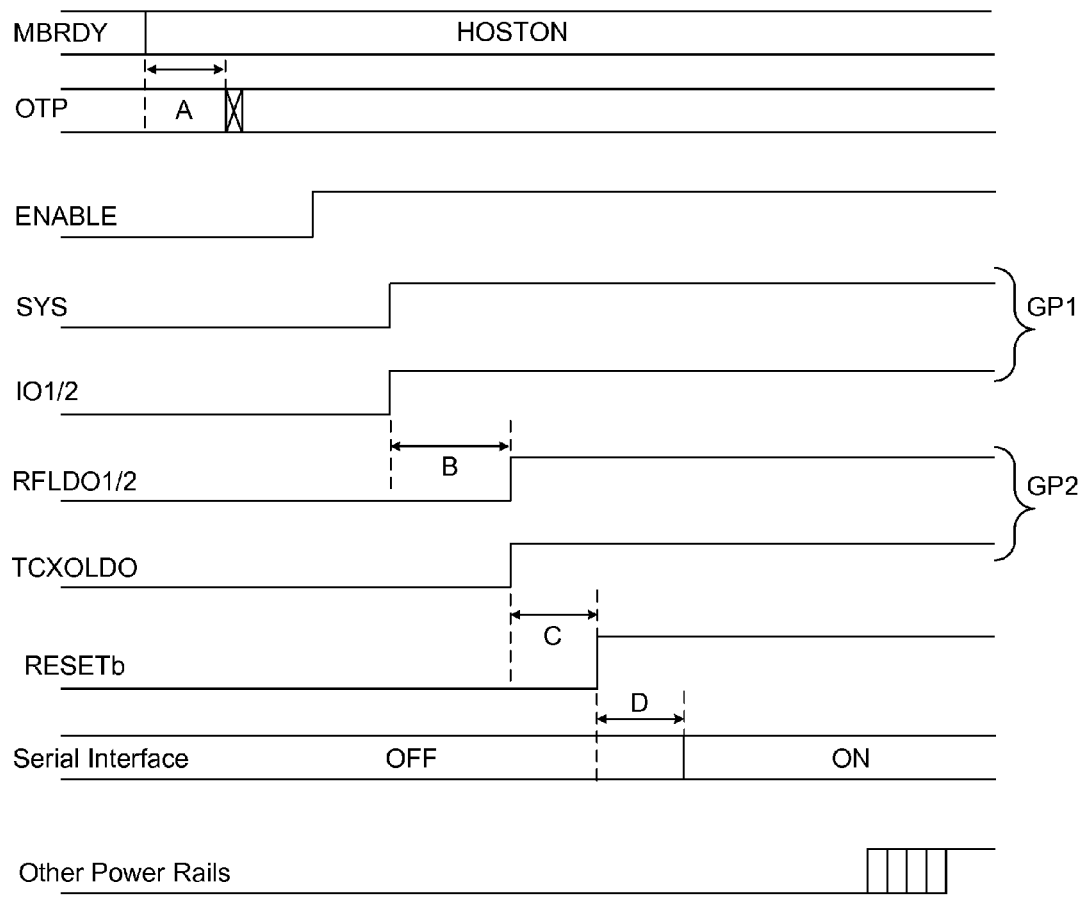
FIG. 3 illustrates a timing diagram for power rail bring up in the system of FIG. 1 according to an example embodiment.

Before turning to FIG. 3 for a description of an example power rail bring up sequence in the system 10, various manners in which logic values are written to the power rail operating registers 202, 204, 206, etc. in the system 10 are briefly described. Logic values are written to the power rail operating registers 202, 204, 206, etc. in the system 10, generally, by either the PMU controller 101 or by the host SOC 130 via the serial interface 128. On behalf of the host SOC, the power manager 131 may communicate commands over the serial interface 128 to update the operating registers 202, 204, 206, etc. in the system 10.

In one embodiment, the power manager 131 may update logic values in the operating registers 202, 204, 206 by directly addressing and writing to the operating registers 202, 204, 206. In other words, the power manager 131 may communicate each of a command to write data, an address to access an operating register for the write, and the data to be written over the serial interface 128. Further, to accelerate updates to the operating parameters for certain power rails, the serial interface slave (FIG. 1) of the PMU 100 includes circuitry and logic to directly latch data received from the power manager 131 into registers of the PMU 100. The ability to directly latch data permits changes to mode and voltage operating settings to be quickly imparted. The ability to directly latch data into the registers of the PMU 100 is accomplished, according to certain aspects, even though the operating frequencies of the power manager 131, the serial interface 128 (which may be a synchronous interface), and the PMU 100 are different from each other. It is finally noted that, in some embodiments, the serial interface 128 is configured to communicate data in 16 bit words. Thus, in a single write command operation over the serial interface 128, the power manager 131 can update or modify operating modes for an entire group operating register and group of power rails.

FIG. 3 illustrates a timing diagram for power rail bring up in the system of FIG. 1 according to an example embodiment. It is noted that the timing diagram in FIG. 3 is provided by way of example only and is not intended to limit the embodiments described herein to the timings illustrated. Further, not every aspect of the timing diagrams are drawn to scale in time, and variations in timing are within the scope and spirit of the embodiments.

In FIG. 3, main battery ready MBRDY and HOSTON operating states or statuses of the PMU 100 over time are illustrated. In general, the PMU 100 enters the HOSTON state once sufficient battery charge is available in the system battery 182 (FIG. 1) to support the operation of digital circuitry in the PMU controller 101, when PMU 100 receives an input or control signal to power on, and/or based on other suitable conditions of the PMU 100. According to the example in FIG. 3, upon entering the HOSTON state, the PMU controller 101 writes operating parameter data from the OTP map 106 to one or more operating registers for the power rails 120-124 after the time period "A". After some wait time, the PMU controller 101 enables one or more of the power rails.

As illustrated in FIG. 3, one or more of the power rails are powered up in a staggered fashion over time. The power rails may be powered up in the staggered fashion to avoid current spikes, etc. For example, the SYS power rail and IO1 and IO2 power rails may be powered up first, followed by the RDLDO1, RDLFO2, and TCXOLDO power rails after the time period "B". After another time period "C", the host SOC 130 may be released for power up by releasing the RESETb control signal from the PMU 100 to the host SOC 130.

In various embodiments, certain power rails may be grouped together during power up. As one example, the SYS, IO1, and IO2 power rails may be powered up together as a first group GP1, and the RDLDO1, RDLFO2, and TCXOLDO power rails may be powered up together as a second group GP2. Additional groups and arrangements of groups of power rails are within the scope and spirit of the embodiments.

Upon releasing the host SOC 130, according to further aspects of the embodiments, the power manager 131 initializes and/or releases the serial interface 128 for communication after the time period "D". Communication between the power manager 131 and the PMU 100 is then available, and the power manager 131 may request system status data from the PMU 100, evaluate the system status data, and communicate various commands to set operating settings and power up additional power rails in the system 10. The additional power rails may be powered up in individually and/or in groups according to any suitable order, sequence, and timing determined by the host SOC 130 and/or the power manager 131.

It is noted that, in the system 10, one or more of the wait times or timings "A"-"D" may be configured and/or predetermined, for example, according to a programmed setting in the OTP map 106. Further, it should be appreciated that the power manager 131, when modifying certain operating parameters by communicating over the serial interface 128, is able to modify operating parameters for more than one power rail using a single write command. For example, the power manager 131 can update or modify operating modes for the entire group of power rails SYS, IO1, IO2, RFLDO1, RFLDO2, TCXOLDO, XLDO, and YLDO in FIG. 2 by writing a word (i.e., 16 bits) of data to the group operating register 202 (FIG. 2). On the other hand, the power manager 131 can update or modify operating modes of power rails individually, for example, by writing a word of data to the general operating register 206.

As compared to a system where the PMU 100 individually controls operating settings and power up timings for every power rail, embodiments of the system 10 provide additional flexibility and speed in control of the power rails. The PMU 100 is not required to maintain programmed mode, voltage, and timing settings for every power rail, and the size of the OTP map 106 may be reduced, saving costs. Further, based on the grouped arrangement of mode settings, for example, for certain power rails, power mode registers may be reduced in the PMU 100. Also, based on the grouped arrangement of mode settings for power mode registers, operating parameters for the power registers may be updated more efficiently. Thus, output voltages and modes of power rails may be transitioned by the PMU 100 quickly and, for example, the system 10 may be placed into a low power mode with only a single (or few) commands from the power manager 131.

The power manager 131 may also take a more directed, efficient, and/or flexible approach to the power up sequence of power rails based on system status data communicated over the serial interface 128. System status data such as the voltage VBat of the system battery 182, a temperature of one or more components in the system 10, a voltage of a battery charger coupled to the system 10, etc. may be communicated to the power manager 131 and evaluated before the power manager 131 determines an appropriate sequence and timing of additional power rails to be powered up. This flexibility may not have been available, if the power up sequence of power rails was dependent upon only the predetermined programmed values in the OTP map 106.

Figure 4:
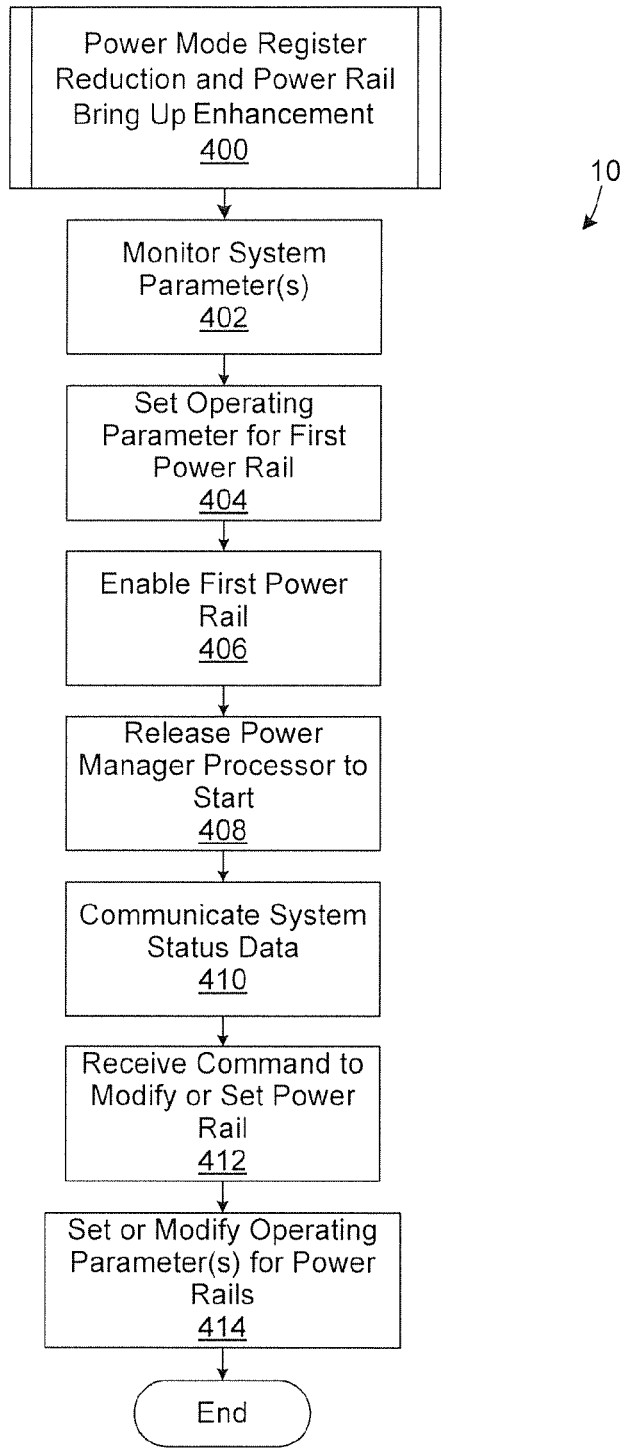
FIG. 4 illustrates a process flow diagram for a method of power mode register reduction and power rail bring up performed by the system of FIG. 1 according to an example embodiment.

Turning to FIG. 4, process flow diagrams illustrating example processes performed by a system for power mode register reduction and power rail bring up enhancements are provided. While the process flow diagrams are described in connection with the system 10 and PMU 100 of FIG. 1, it is noted that other systems and/or power management units or circuits may perform the illustrated processes. That is, in various embodiments, systems similar to the system 10 may perform the processes illustrated in FIG. 4.

In certain aspects, the flowcharts of FIG. 4 may be considered to depict example steps performed by the PMU 100 of the system 10 according to one or more embodiments. Although the process diagrams of FIGS. 4 illustrate an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

FIG. 4 illustrates a process flow diagram for a process 400 of power mode register reduction and power rail bring up performed by the PMU 100 of the system 10 of FIG. 1 according to an example embodiment. At reference numeral 402, the process 400 includes monitoring a system parameter of a system. With reference to the system 10 of FIG. 1, the monitoring may be performed by the PMU 100 of the system 10. The monitoring may include monitoring the voltage VBat of the system battery 182, monitoring the temperature of one or more components in the system 10, etc., and associated system status data may be stored by the PMU 100.

At reference numeral 404, the process 400 includes setting an operating parameter for a first power rail according to a predetermined programmed setting. For example, the PMU 100 may set an operating parameter for a first of the power rails 120-124 based on or according to predetermined programmed settings in the OTP map 106, as described above with reference to with FIGS. 2 and 3. In some embodiments, setting an operating parameter at reference numeral 404 may include writing data bits to an operating register for the first power rail. The operating register may be embodied as part of the register bank 103 of the PMU 100. Also, in some embodiments, setting the first power rail may include setting a group of power rails or first power rails at one or more different timings or groups of timings. In FIG. 3, for example, the SYS, IO1, IO2, RFLDO1, RFLDO2, and TCXOLDO power rails may be considered first power rails, collectively.

Turning to reference numeral 406, the process 400 includes enabling the first power rail. In this context, the first power rail or plurality of first power rails may be enabled after or among certain predetermined wait times as described herein. At reference numeral 408, the process 400 includes releasing a processor to start. As described herein, the processor released to start may include the host SOC 130 or one or more processors with in the host SOC, such as the application processor 140 of the power management processor 131.

At reference numeral 410, the process 400 includes communicating system status data to the processor released at reference numeral 408. For example, as described above with reference to FIG. 3, after the serial interface 128 is released for communication, system status data may be communicated between the PMU 100 and the power manager 131 via the serial interface 128. As described herein, the system status data may be any data gathered and stored by the PMU 100 in connection with the current operating status of the PMU 100 and the system 10. This system status data may be relied upon by the power manager 131 when determining a sequence to power up one or more second or additional power rails.

At reference numeral 412, the process 400 includes receiving at least one of a command to modify the operating parameter for the first power rail or a command to set an operating parameter for a second power rail. Here, the PMU 100 may receive one or more commands to modify or set operating parameters for the power rails 120-124. The commands may include commands to modify power rails that were previously set by the PMU 100 (i.e., first power rail or rails) and/or power rails that have yet to be powered up (i.e., second power rail or rails), for example. It is noted that one or more commands may be received over time at reference numeral 412, and the operations at reference numerals 412 and 414 may be operated concurrently in various orders of operation.

At reference numeral 412, the command to modify the operating parameter for the first power rail or to set the operating parameter for the second power rail may include a single command to modify the operating parameters for a group of power rails. For example, the power manager 131 may communicate a command to update mode settings for a group of power rails by accessing the group operating register 202 or 204 of FIG. 2. As a more particular example, at reference numeral 412, the command may include a single command to power down, power up, or change operating modes of each power rail in the group of power rails. The command may also include a command for a single non-grouped power rail, to set mode and/or voltage operating parameters of the power rail.

At reference numeral 414, the process 400 includes, according to the command or commands received at reference numeral 412, setting or writing data bits to one or more general or grouped operating register or registers as described herein. In this manner, the operating modes of various registers may be modified or set for the first time. The writing at reference numeral 414 may be performed by direly latching data into operating registers for various grouped and individual power rails in the PMU 100.

According to embodiments of the process 400, a new and flexible manner in which to power up power rails is available. Power rails may be powered up and adjusted over time faster and with less predetermined programmed settings. The embodiments reduce cost, increase speed, and provide new flexibility for battery-powered systems.

With regard to aspects of the structure or architecture of the system 10, in various embodiments, each of the PMU controller 101, the power processor 132, and or other processors or processing circuits of the system 10 may comprise general purpose arithmetic processors, state machines, or Application Specific Integrated Circuits ("ASICs"), for example. Each such processor or processing circuit may be configured to execute one or more computer-readable software instruction modules. In certain embodiments, each processor or processing circuit may comprise a state machine or ASIC, and the processes described in FIGS. 2 and 3 may be implemented or executed by the state machine or ASIC according to the computer-readable instructions.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A method, comprising:
   setting, by a power management circuit, an operating parameter for a first power rail among a plurality of power rails according to a predetermined programmed setting, wherein setting the operating parameter for the first power rail comprises writing data bits to a respective operating register including at least one power mode bit entry;
   releasing a processor to start; and
   receiving from the processor, via an interface of the power management circuit, at least one of a command to modify the operating parameter for the first power rail or a command to set an operating parameter for a second power rail, wherein the command to modify the operating parameter for the first power rail comprises a single command to power down power a subset of the plurality of power rails, and wherein the subset comprises at least two power rails.

2. The method of claim 1, further comprising:
   monitoring, by the power management circuit, a system parameter of a system; and
   enabling the first power rail based on the system parameter.

3. The method of claim 1, wherein the operating register for the first power rail further comprises at least one on/off bit entry.

4. The method of claim 1, wherein the command to modify the operating parameter for the first power rail comprises a single command to modify the operating parameters for a subset of the plurality of power rails, and wherein the subset comprises at least two power rails; and
   the method further comprises, according to the single command, writing data bits to a grouped operating register for the subset of power rails.

5. The method of claim 4, wherein the grouped operating register for the subset of power rails comprises at least one power mode bit entry for each power rail in the subset of power rails.

6. The method of claim 1, further comprising setting the operating parameter for the second power rail by writing data bits to an operating register for the second power rail.

7. The method of claim 1, further comprising waiting a predetermined amount of time after the setting and before the releasing.

8. The method of claim 1, further comprising communicating, via the interface of the power management circuit, system status data to the processor.

9. A power management device, comprising:
   a plurality of power rails; and
   a controller circuit that:
   sets an operating parameter for a first power rail of the plurality of power rails according to a predetermined programmed setting by writing data bits to a respective operating register including at least one power mode bit entry;
   releases a processor to start; and
   in accordance with a command received from the processor, at least one of modifies the operating parameter for the first power rail or sets an operating parameter for a second power rail of the plurality of power rails, wherein the command to modify the operating parameter for the first power rail comprises a single command to power down a subset of the plurality of power rails, and wherein the subset comprises at least two power rails.

10. The device of claim 9, wherein the controller circuit further monitors a system parameter of a system and enables the first power rail based on the system parameter.

11. The device of claim 9, wherein the operating register of the first power rail comprises at least one on/off bit entry.

12. The device of claim 9, further comprising:
a grouped operating register for a subset of the plurality of power rails, the subset of the plurality of power rails including the first power rail, wherein
the controller circuit further modifies the operating parameters for the subset of the plurality of power rails in accordance with a single command received from the processor by writing data bits to the grouped operating register.

13. The device of claim 12, wherein the grouped operating register comprises at least one power mode bit entry for each power rail in the subset of the plurality of power rails.

14. The device of claim 9, wherein the controller circuit further sets the operating parameter for the second power rail by writing data bits to an operating register for the second power rail.

15. A method, comprising:
setting, by power management circuit, an operating parameter for a first power rail among a plurality of power rails according to a predetermined programmed setting, wherein setting the operating parameter for the first power rail comprises writing data bits to a respective operating register including at least one power mode bit entry;
communicating, via an interface of the power management circuit, system status data to a processor;
receiving, via the interface of the power management circuit, at least one of a command to modify the operating parameter for the first power rail or a command to set an operating parameter for a second power rail, wherein the command to modify the operating parameter for the first power rail comprises a single command to power down a subset of the plurality of power rails, and wherein the subset comprises at least two power rails.

16. The method of claim 15, wherein the operating register for the first power rail comprises at least one on/off bit entry.

17. The method of claim 15, wherein the method further comprises, according to the single command, writing data bits to a grouped operating register for the subset of power rail.

18. The method of claim 15, wherein the grouped operating register for the subset of power rails comprises at least one power mode bit entry for each power rail in the subset of power rails.

19. The method of claim 6, wherein the operating register for the second power rail comprises at least one on/off bit entry, at least one mode bit entry, and at least one voltage bit entry.

20. The method of claim 14, wherein the operating register for the second power rail comprises at least one on/off bit entry, at least one mode bit entry, and at least one voltage bit entry.

* * * * *